(12) United States Patent
Waldrop

(10) Patent No.: US 10,840,908 B2
(45) Date of Patent: *Nov. 17, 2020

(54) SYSTEMS AND METHODS FOR CONTROLLING SEMICONDUCTOR DEVICE WEAR

(71) Applicant: Micron Technology, Inc., Boise, ID (US)

(72) Inventor: William C. Waldrop, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/552,633

(22) Filed: Aug. 27, 2019

(65) Prior Publication Data

US 2020/0059235 A1 Feb. 20, 2020

Related U.S. Application Data

(63) Continuation of application No. 16/105,751, filed on Aug. 20, 2018, now Pat. No. 10,447,267.

(51) Int. Cl.
*H03K 19/00* (2006.01)
*H03K 19/003* (2006.01)
*H03K 19/20* (2006.01)
*G11C 11/4076* (2006.01)
*H03K 5/134* (2014.01)

(52) U.S. Cl.
CPC .... *H03K 19/00384* (2013.01); *G11C 11/4076* (2013.01); *H03K 5/134* (2014.07); *H03K 19/003* (2013.01); *H03K 19/00369* (2013.01); *H03K 19/20* (2013.01)

(58) Field of Classification Search
CPC .......... H03K 19/003; H03K 19/00369; H03K 19/00384; H03K 5/134; G11C 11/4076
See application file for complete search history.

(56) References Cited

U.S. PATENT DOCUMENTS

| | | | |
|---|---|---|---|
| 7,944,242 | B2 | 5/2011 | Wade et al. |
| 7,948,261 | B2 | 5/2011 | Kawakami |
| 8,299,825 | B2 | 10/2012 | Noorlag et al. |
| 8,947,971 | B2 | 2/2015 | Kodama |
| 9,257,977 | B1 | 2/2016 | Chang |
| 10,110,229 | B1 | 10/2018 | Lau |
| 2010/0231258 | A1 | 9/2010 | Iwai |
| 2015/0084677 | A1 | 3/2015 | Van De Graaff |

*Primary Examiner* — Vanthu T Nguyen
(74) *Attorney, Agent, or Firm* — Fletcher Yoder, P.C.

(57) ABSTRACT

Systems, methods, and devices are provided for increasing uniformity of wear in semiconductor devices due to, for example, negative-bias temperature instability (NBTI). The method may include receiving a first NBTI control signal. The method may involve receiving a second NBTI control signal based at least in part on the first NBTI control signal. The method may also involve asserting the first NBTI control signal at a clock input pin of a latch. Further, the method may include asserting the second NBTI control signal at a data input pin of the latch. The method may additionally involve toggling electrical elements downstream of the latch based at least in part on an output of the latch based on the first and second NBTI control signals to increase uniformity of wear on the electrical elements in a default low-power state during NBTI toggling mode.

20 Claims, 4 Drawing Sheets

SYSTEMS AND METHODS FOR CONTROLLING SEMICONDUCTOR DEVICE WEAR

CROSS-REFERENCE TO RELATED APPLICATION

The present application is a continuation of U.S. application Ser. No. 16/105,751, entitled "Systems And Methods For Controlling Semiconductor Device Wear," and filed on Aug. 20, 2018, the entirety of which is incorporated by reference herein for all purposes.

BACKGROUND

The present disclosure relates generally to the field of semiconductor devices and, more particularly, to techniques for increasing uniformity of wear in semiconductor devices. This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electrical systems often include components that use one or more semiconductor devices (e.g., semiconductor elements), such as diodes and transistors. For example, the electrical system may be a computing system that uses semiconductor devices in logic circuits of microcomputers, memory, and gate arrays for digital logic functionality. The electrical system, or a portion of the electrical system, may occasionally operate in low-power modes to improve operational efficiency, such as power consumption. In low-power modes however, the semiconductor devices in the logic circuits may receive static (e.g., idle) data signals for long periods of time. The consistent stress on the semiconductor devices, which occurs when the semiconductor devices remain in the same state for extended periods of time due to the static data signals, may increase susceptibility of the devices to reliability issues. For example, the steady-signal wear may cause additional wear due to negative-bias temperature instability (NBTI) as compared to when the devices operate in default modes.

The increased susceptibility may lead to degradation of device performance. For example, switching speed of the devices may slow down due to degradation by NBTI. Further, the deterioration of device performance due to NBTI may vary between devices and circuit paths of the logic circuits, resulting in non-uniform wear of the devices and timing violations by the logic circuits. Accordingly, embodiments of the present disclosure may be directed to techniques for controlling uneven wearing on devices due to NBTI.

BRIEF DESCRIPTION OF THE DRAWINGS

Various aspects of this disclosure may better be understood upon reading the following detailed description and upon reference to the drawings in which.

DETAILED DESCRIPTION

Figure 1:
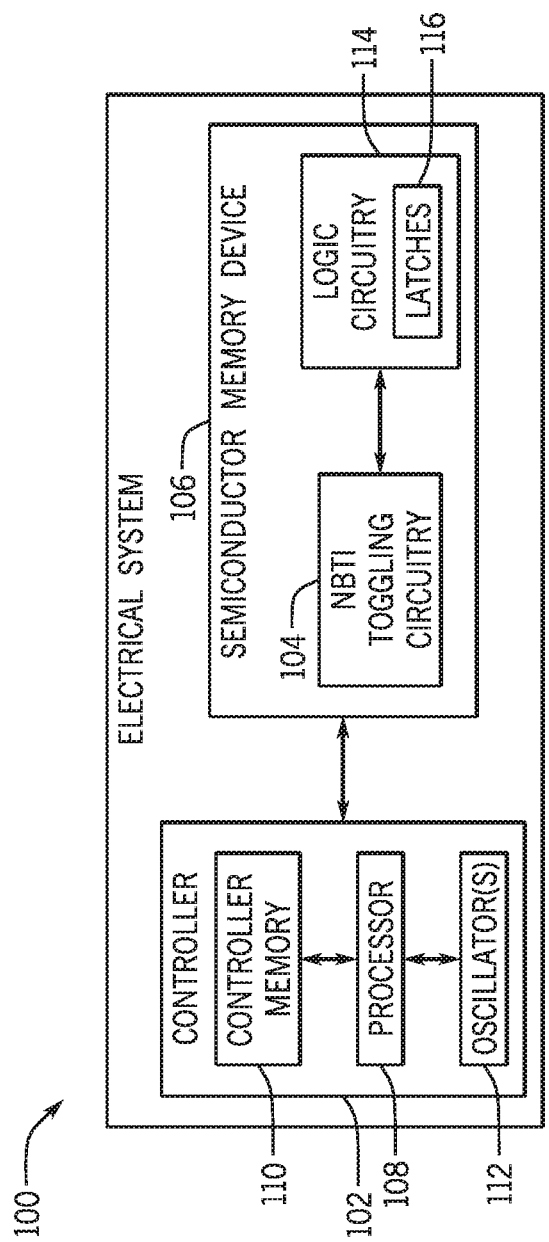
FIG. 1 is a block diagram of an electrical device including negative-bias temperature instability (NBTI) toggling circuitry, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to semiconductor devices that are subject to reliability issues. Generally, electrical systems may include a number of semiconductor devices (e.g., diodes and transistors) that form logic circuits in components of the electrical system, such as microcomputers, memory, gate arrays, and the like. In some embodiments, the semiconductor devices may be subject to a variety of performance issues that may inhibit their performance reliability.

One such performance issue is negative-bias temperature instability (NBTI) (e.g., slow trap), which occurs when a negative biasing voltage is applied to the semiconductor device, such as a P-metal oxide semiconductor field effect transistor (PMOSFET). Briefly, when the negative biasing voltage is applied, the carrier (e.g., positive carrier holes) may become trapped in the bonds of the semiconductor material, thereby generating a fixed charge (e.g., fixed positive charge) and reducing the amount of available carriers. This fixed charge may result in eventual deterioration of device performance characteristics, such as an increase in a threshold voltage (Vth) (e.g., minimum biasing voltage for creating a conducting path) that causes slower switching speed, increases/introduces signal duty-cycle issues, and slower propagation delay shifts, among others. For example, semiconductor devices affected by NBTI may violate timing constraints of the electrical system and cause the logic circuits that they are part of to fail to function properly.

In some embodiments, the electrical system, or a portion of the electrical system, may occasionally operate in low-power modes (e.g., sleep mode, clock gating mode) to improve operational efficiency, such as power consumption. For example, certain logic circuitry may enter standby mode when there is no data input to the electrical system. In low-power modes, the inputs (e.g., logic low inputs) to the circuit paths of the logic circuitry and thus, to the semiconductor devices, may be static for extended periods of time, such that the devices remain in the same state for relatively long amounts of time.

The static inputs to the circuit paths may thus continuously stress the semiconductor devices and as such, increase the semiconductor device's susceptibility to NBTI deterioration. In other words, performance degradation due to NBTI may occur when a negative biasing voltage is applied regardless of the operation mode of the semiconductor device. In some instances, NBTI performance degradation may have a greater impact on semiconductor devices operating in low-power modes as compared to devices operating in default (e.g., normal) modes since the devices in default modes may be alternatively stressed, allowing for a recovery period.

Deterioration of semiconductor device performance due to NBTI in low-power modes however, may not occur evenly for all semiconductor devices and circuit paths. When there is uneven wearing of the semiconductor devices in the logic circuit or in a single circuit path of the logic circuit, the logic circuits may fail to function properly and/or may fail to function completely. For example, variations in switching speed may result in propagation delay shifts that collapse a clock duty-cycle used to control the logic circuit. The uneven wearing may be caused by variations in material impurities of the device, variations in the circuitry of each circuit path, and/or variations in the circuit path length. As may be appreciated, it may be advantageous to uniformly wear the semiconductor devices of one or more circuit paths to maintain logic functionality.

To evenly wear the devices while in low-power modes, data signals (e.g., NBTI control signals) may be transmitted down certain circuit paths (e.g., toggle circuit paths) at low rates during an NBTI toggle mode. The NBTI control signals sent along these circuit paths may increase equalization of an amount of stress to each of the devices on the circuit paths, thereby increasing uniformity of wear for the devices. As an example, an asynchronous NBTI oscillator may generate an NBTI control signal that is shared among multiple circuit paths to more evenly distribute wear leveling. The NBTI oscillator may be considered asynchronous since the toggling of the circuit paths may not be governed by a clock during low-power modes.

For paths that contain latches, timing of the toggling of the one or more circuit paths may be controlled to enable the NBTI control signals to propagate downstream of the latch and thereby, somewhat evenly stress downstream devices when in low-power mode. Briefly, latches may exist in one of two stable states (e.g., set state and reset state). The state of the latch may be determined based on the signals applied to one or more control input pins of the latch. Depending on the type of latch (e.g., flip-flops, set-reset (SR) latches, D-type flip flops), the control input signal may include a reset signal, a set signal, a clock signal, and/or a data signal, such as a command signal or an address signal. During NBTI toggling mode, the clock signal and data signal may be NBTI control signals. For example, in some latches, the set signal or the reset signal may be applied to set or reset pins of the latch, respectively, such that the latch is set to an initial state before the NBTI control signals are transmitted along the circuit path. The latch may receive the NBTI control signals at a data input pin and/or at a clock input pin, which may control the periods during which the latch may be open (e.g., transmitting an output). As such, the latches may have one or more outputs that are determined by the control input signals.

When the timing of the NBTI control signals is controlled with the timing of clock signals, and in some embodiments, with the set and/or reset signals, the latch may transmit the NBTI control signals further downstream. For example, a latch that spans (e.g., receives input from) multiple paths may receive a clock signal of a large pulse duration from a first circuit path and an NBTI control signal with a relatively smaller pulse duration from a second circuit path. Because the clock signal has a larger pulse duration (e.g., logic high signal), it may sync with the NBTI control signal at the latch, enabling the NBTI control signal to propagate through.

However, controlling the timing of the clock signal with that of the NBTI control signal to the latch may be difficult and result in non-deterministic control of the latches. In instances where the timing is not tightly controlled, the clock signal may block the latch from internally toggling. That is, the NBTI control signals and/or the set and reset signal may miss the active window (e.g., logic-high clock pulse) of the clock signal, preventing the latch from being in a state that allows for further propagation of the NBTI control signal. For example, a single NBTI control signal used to asynchronously control both the toggle of the clock pin and of the data pin of the latch may fail to coordinate the toggles at the pins since the single NBTI control signal may not reach the data pin and clock pin at substantially the same time. Failure of control signals to coordinate the reception of signals at the clock pin and at the data pin may be due to differences in path length and/or path delay.

Further, failure to tightly control the toggles may result in setting the latch to an unexpected state. In the unexpected state, latch behavior (e.g., transmission of output) may become unpredictable. For example, the latch may improperly cause the path to exit the NBTI toggle mode before NBTI toggling has completed propagating through the path being toggled. Additionally or alternatively, non-deterministic control of the latches may result in an accidental latching of a signal that becomes a command signal downstream.

Accordingly, the present disclosure provides techniques for increasing uniformity of wearing of semiconductor devices due to negative-bias temperature instability (NBTI) or other wear effects by deterministically controlling latch operation. In some embodiments, a first asynchronous NBTI control signal (e.g., an NBTI clock signal) received by a clock pin of the latch may prioritize the toggling of the clock pin over toggling of other latch pins, thereby reducing sensitivity of the clock pin to NBTI degradation effects and to set latches to their default (e.g., closed, non-transmitting) state. A second asynchronous NBTI control signal (e.g., an NBTI data signal), generated by delaying the first NBTI control signal via delay elements and/or feedback, may control toggling of the data pin of the latch.

Further, in some embodiments, an interlocking scheme may be implemented in conjunction with the clock prioritization to couple the toggling of the clock pin by the first NBTI control signal with the toggle of the data pin by the second NBTI control signal. For example, the second NBTI control signal may toggle the data pin after the first NBTI control signal has toggled the clock pin due to the delayed generation of the second NBTI control signal. This may ensure that the latch remains in its default state so that the second NBTI control signal is not transmitted through the latch and cause unexpected behavior of the latch and downstream hardware during and when exiting the NBTI toggling mode.

To propagate the second NBTI control signal downstream of the latch to mitigate downstream NBTI impact for the circuit path, in some embodiments, the latch may receive a set signal and/or a reset signal from the controller. For downstream latches, their set and/or reset pins may be controlled and/or timed by the second NBTI control signal in a deterministic manner to allow further propagation of the second NBTI control signal. Additionally, during exiting of the NBTI toggling mode and in some cases, the low-power mode, toggling of the data pin and of the clock pin may be stopped simultaneously or in reverse order (e.g., remove the second NBTI control signal and then the first NBTI control signal) to allow the hardware logic (e.g., latches) of the circuit path to immediately return to the default state so that no unexpected operations occur.

With this in mind, FIG. 1 illustrates an electrical system 100 that includes NBTI toggling circuitry 104, in accordance with an embodiment of the present disclosure. The electrical system 100 may include a controller 102 that controls operations of the toggling circuitry 104, semiconductor memory device 106, and/or other portions of the electrical system 100. Although the figure refers to the semiconductor memory device 106 as a memory device, the semiconductor memory device may include any electrical devices that have electrical components that may undergo uneven wear due to low-power modes. In some embodiments, the controller 102 may be included in the semiconductor memory device 106.

The controller 102 may indicate (e.g., signal) to the NBTI toggling circuitry 104 to toggle one or more circuit paths of the memory device 106 in NBTI toggling mode. To facilitate the controlling operation, the controller 102 may include a processor 108, such as a microprocessor, and controller memory 110. In some embodiments, the processor 108 may execute instructions stored in the controller memory 110. Additionally, in some embodiments, the controller memory 110 may be included in local memory of the electrical system 100, cloud storage, a separate tangible, non-transitory, computer readable medium, or any combination thereof. Further, the controller 102 may comprise plurality of processors 108 that share system control.

The controller 102 may also include one or more oscillators 112 that act as clocks for the electrical system 100. The oscillator(s) 112 may be a crystal oscillator of piezoelectric material and may generate a string of pulses with a toggling frequency specified by the processor 108. The pulses may be transmitted to the semiconductor memory device 106 and further, to synchronous logic circuitry units to synchronize changes in the state of logic elements with the oscillator signal. For example, the oscillators may periodically send the oscillator signal to the memory device 106 to refresh the memory device 106 when in low-power mode. A single oscillator 112 may be associated with one synchronous circuit path or with multiple synchronous circuit path. For example, as discussed below, an oscillator 112 may drive a clock signal to a clock input pin for a latch in a synchronous circuit path during normal operating modes. In some embodiments, the clocks may be internally generated in the semiconductor memory device 106.

The controller 102 may be communicatively coupled to the toggling circuitry 104 and may provide instructions to toggle portions of the electrical system 100. For example, when the controller 102 instructs the memory device 106 to enter low-power mode by shutting off the oscillator 112 signal, the controller 102 may instruct the NBTI toggling circuitry 104 to generate one or more NBTI control signals that are sent in place of the oscillator 112 signal to the logic circuitry 114 to increase uniformity of wear of the semiconductor devices (e.g., semiconductor elements) of a logic circuit 114. A single NBTI control signal may control a single circuit path or multiple circuit paths. For instance, a single NBTI control signal may toggle a first circuit path that is coupled to the clock pin of a latch and a second circuit path that is coupled to the data pin of the latch. The NBTI control signal may be asynchronous and during NBTI toggling mode, may asynchronously control circuit paths. In other words, the timing of the NBTI control signal may not be governed by the oscillator 112 and instead, may be governed by signals from the controller 102 that indicate completion of a particular operation (e.g., entrance of the memory device 106 into low-power mode).

As mentioned above, the memory device 106 may receive indications from the NBTI toggling circuitry 104 and/or the controller 102. The memory device 106 may be a dynamic random-access memory (DRAM) device that receives command signals, address signals, data signals, and timing signals from the controller 102 via pins. The memory device 106 may include logic circuitry 114 that facilitate operations of the memory device 106, such as storage and access of data to and from memory cells of the memory device 106. For example, the logic circuitry 114 may receive commands via command signals that instruct the logic circuitry 114 to store data received via a data signal.

The logic circuitry 114 may include one or more circuit paths including hardware logic (e.g., latches) that together, provide digital logic functionality. Latches 116 may play an important role in the logic circuitry 114 as they may provide local storage for data being processed by the logic circuitry 114 and signal propagation control along one or more paths. As discussed above, latches 116 may operate in one of two states, and the state may be determined based on signals (e.g., reset signal, a set signal, the clock signal, and/or a data signal) applied to one or more control inputs of the latch. The output of the latches 116 may be determined by the control inputs. It should be appreciated that the terms used to describe components of the system, like many of the other terms used herein, may share some referents and, as such, should not be narrowly construed. Further, it should be understood that some embodiments of the electrical system 100 may include only a portion of the components shown and/or additional components.

To control the low-power mode NBTI wearing of semiconductor elements in circuit paths that contain latches 116, the timing of the signal received at the clock pin and the data pin of the latch may be controlled so that the NBTI control signal is transmitted through the latch 116 and is able to evenly stress downstream semiconductor elements. For example, a single NBTI control signal sent by the toggling circuitry 104 may be used to drive the signals at the clock pin and the data pin of one or more of the latches 116. However, it may be difficult to tightly control the timing of the signals received at the clock pin and the data pin. As an example, because of variations in path length, voltage, and temperature, some latches 116 may transmit the NBTI control signal downstream while others may not when a single NBTI control signal is used. This may result in uneven wearing of semiconductor elements on one or more circuit paths. Further, because the input to the latches 116 may vary unpredictably, one or more latches 116 may have an unexpected logic state, resulting in the latches 116 operating in an indeterminate state that has unpredictable behavior, such as accidental latching of an activate command.

Figure 2:
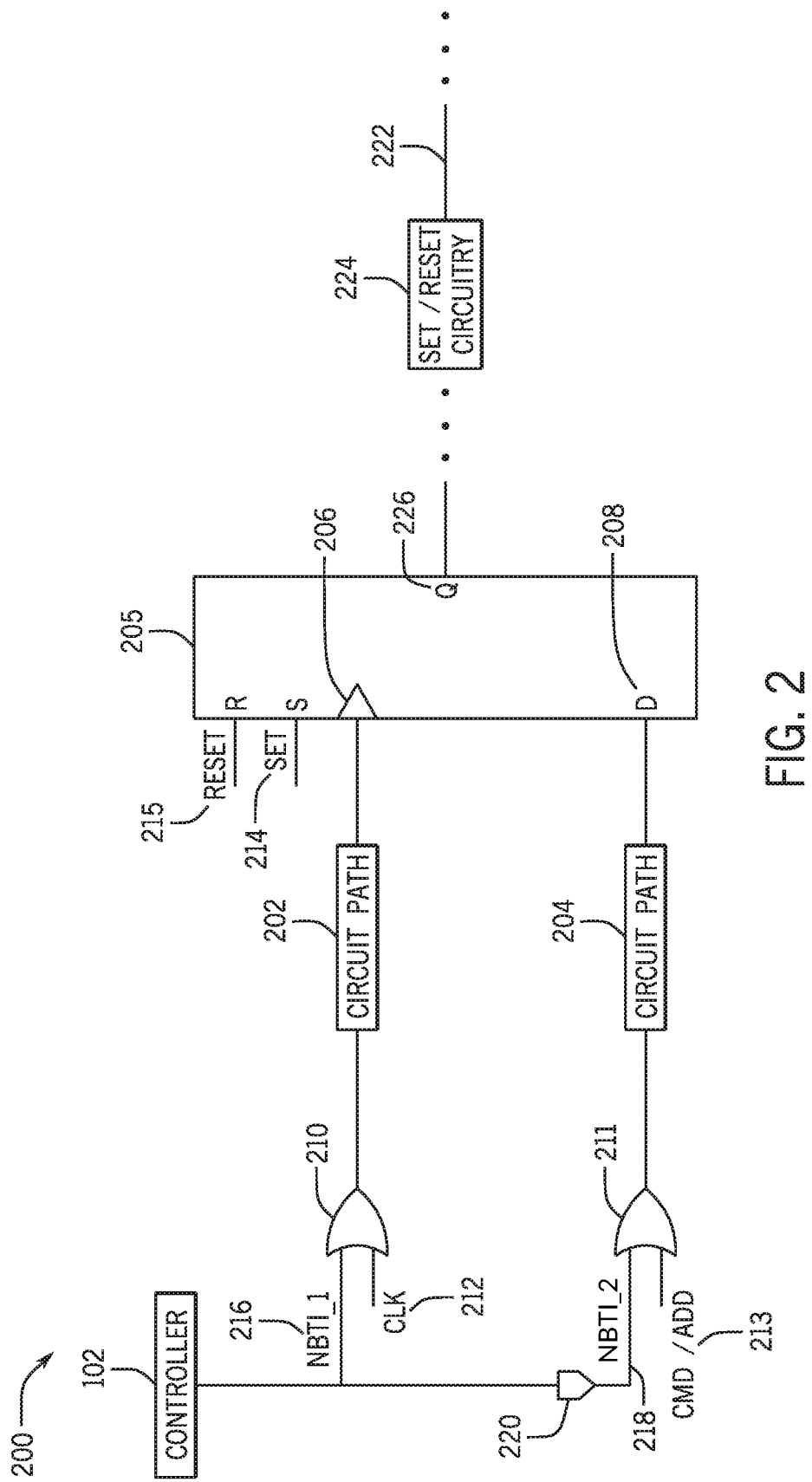
FIG. 2 is a block diagram of circuitry that increases uniformity of semiconductor device wear, in accordance with an embodiment of the present disclosure.

Accordingly, FIG. 2 illustrates a block diagram of circuitry 200 that may control the uniform wearing of semiconductor elements due to NBTI with reduced likelihood of an indeterminate latch state issue, in accordance with an embodiment of the present disclosure. The circuitry 200 may be a portion of the logic circuitry 114 of the semiconductor memory device 106 that may include two circuit paths 202, 204 of varying lengths (e.g., differing number of logic units) and propagation time (e.g., due to differing delay times across each logic unit). For example, in some embodiments, the circuit paths 202 and 204 and the controller 102 may be included in the NBTI toggling circuitry 104. The circuit paths 202, 204 may be joined together at a latch 205, such as a D-type flip-flop, and be used to drive the latch 205 by toggling a clock pin 206 and a data pin 208. Additionally, the circuit paths 202, 204 may include OR gates 210, 211 that may transmit a logic high output when at least one of the inputs to the OR gates 210, 211 is a logic high.

During default (e.g., normal) operation modes, the OR gate 210 of circuit path 202 may receive an oscillator signal (CLK) 212 from the controller 102 and may transmit the CLK 212 to the clock pin 206 to toggle the clock pin 206. The controller 102 may also transmit a data signal (CMD/ADD) 213 to the OR gate 211, and the data signal may propagate along the circuit path 204 to toggle the data pin 208 of the latch 205. The CMD/ADD 213 may be a command signal or an address signal used to perform and/or locate a portion of the memory device 106, respectively. The controller 102 may coordinate the timing of the CMD/ADD 213 with that of the CLK 212 so that the latch 205 may receive the CMD/ADD 213 and the CLK 212 without the CLK 212 blocking the CMD/ADD 213. That is, the controller may coordinate the timing of the CLK 212 with the CMD/ADD 213 so that the latch 205 may be able to transmit the CMD/ADD 213 downstream.

Further, the controller may transmit a set signal (SET) 214 and/or a reset signal (RESET) 215 to the set pin (S) and the reset pin (R), respectively. The SET 214 and/or RESET 215 may control the state of the latch 205 and thus, whether the latch 205 will transmit the CMD/ADD 213 signal to a downstream circuit path 222 when the CMD/ADD 213 signal arrives at the data pin 208. Furthermore, the controller may coordinate the timing of the SET 214 and/or RESET 215 with that of the CMD/ADD 213 and CLK 212 for synchronous control of latch 205 behavior to ensure that the SET 214 or RESET 215 do not occur during latching of the CMD/ADD 213. During normal operating modes, the NBTI control signals (e.g., NBTI_1 216 and NBTI_2 218) may not be applied to the circuit paths 202, 204 since the synchronization of the input control signals generally ensures equal stress to the semiconductor elements of the circuit paths 202, 204, and 222.

As previously noted, the controller 102 may periodically cause the memory device 106 to enter a low-power mode, such as when no inputs are being received by the electrical system 100 for a period of time. In low-power modes, the memory device 106 may no longer receive the CLK 212 as the oscillator 112 may be shut down by the controller 102 to conserve power. The memory device 106 may hold one or more electrical elements static for an extended period of time, causing the semiconductor elements of the circuit paths 202, 204 to remain in the same state for relatively long amounts of time. The static input may continuously and/or unevenly stress elements of the semiconductor memory device 106 and as such, increase the semiconductor elements' susceptibility to uneven NBTI deterioration. To at least partially even out wearing of the semiconductor elements while in low-power modes, the NBTI control signals 216 and 218 may be transmitted to the logic circuitry 114 at low rates during an NBTI toggle mode. For example, the NBTI toggling circuitry 104 may transmit an NBTI control signal on one or more circuit paths.

When the timing of the NBTI control signals received at the clock pin and the data pin is not controlled on circuit paths that contain latches 205 (e.g., the circuit path 202, 204), the NBTI control signal may be blocked from propagating beyond the latch 205. As an example, the memory device 106 may enter the NBTI toggling mode whereby an NBTI control signal (e.g., NBTI_1) may be simultaneously transmitted to circuit paths 202 and 204 by the toggling circuitry 106 as a logic high. However, because the circuit paths 202 and 204 may differ in total propagation time and length, the logic low NBTI_1 216 may take longer to propagate across one circuit path (e.g., circuit path 202) as compared to the other (e.g., circuit path 204). The asynchronous nature of the NBTI control signals may result in the NBTI_1 216 reaching the data pin 208 before NBTI_2 218 reaches the clock input 206. This may result in the latch 205 not propagating the NBTI_1 216 downstream to provide even wearing of the downstream elements.

Further, when the memory device 106 exits the NBTI toggling mode, the oscillator 112 may turn on and transmit the CLK 212 to the circuit path 202 in close timing proximity to that of the NBTI_1 216 at the data pin 208. The timing of the CLK 212 may unintentionally coordinate with the timing of the NBTI_1 216 resulting in the accidental latching of the NBTI_1 216, such that the NBTI_1 216 is wrongfully interpreted as a command signal downstream. In some embodiments, the accidental latching of potential command signal may occur when starting, during, and/or exiting the NBTI toggling mode. Further, asynchronously controlling the latch 205 using the NBTI control signal may result in unexpected changes to the latch state, such that latch operations may become indeterminate and lead to, for example, sudden exit from the NBTI toggle mode causing potential misinterpretation of future commands and/or addresses.

To overcome the indeterminate latch issue, toggling of the input pin 206 may be prioritized over toggling of the data pin 208 to allow the clock pin to toggle freely of other input signals as it did when not in NBTI toggle mode. As such, in the circuitry 200, the CLK may be inactive as the oscillator 112 is shut down. The asynchronous NBTI_1 216 may be generated by the toggling circuitry 104 and may propagate down the circuit path 202 to eventually control the toggle of the clock pin 206.

In some embodiments, the NBTI_1 216 may be allowed to toggle the clock pin 206 with priority. That is, the NBTI_1 216 may reach the clock input 206 prior to other control signals reaching other input pins of the latch 205. By toggling the clock input 206 first, the NBTI_1 216 may set the latch 205 to its default state (e.g. closed in low-power modes). The default state may prevent signals from propagating downstream, averting latching of toggling signals that may be improperly interpreted as commands to downstream logic circuitry 222. Additionally, because priority is given to the clock pin 206, it may be ensured that the latch 205 is set to the default state, such that the latch may not exhibit unexpected behavior, for example, when exiting the NBTI toggling mode.

A second NBTI control signal (NBTI_2) 218 may be transmitted along the circuit path 204 to the data pin 208.

The NBTI_2 218 may be a delayed version of the NBTI_1 216 used to control the toggle of the clock pin 206. In some embodiments, the delay is introduced using delay element 220. In some embodiments, the delay element 220 may be omitted from the circuitry 200. Instead, in such embodiments, the controller 102 may transmit the NBTI_2 218 after some period of time has elapsed since NBTI_1 216 has been transmitted. Forcing NBTI_2 218 to arrive at the data pin 208 after NBTI_1 216 arrives at the clock pin 206 may be referred to as an "interlocking scheme".

The interlocking scheme, along with clock prioritization, may ensure that the latch 205 is already set to its default state before NBTI_2 218 is received at the data input 208. As such, the latch 205 may not transmit the NBTI_2 218 through the latch by default, reducing or eliminating unexpected behavior of the latch 205 and of downstream logic circuitry 222 during or when exiting the NBTI toggling mode. Further, clock prioritization and interlocking may ensure that the NBTI_2 218 will be latched for propagation downstream once instructed to do so by the controller 102.

To allow the NBTI_2 218 to propagate downstream to evenly wear downstream semiconductor elements, in some embodiments, the NBTI_2 218 may also be used to control timing of the SET 214 and/or the RESET 215 to the set pin S and reset pin R of the latch 205, respectively. As an example, when the NBTI_1 216 at the clock pin 206 is high, then the NBTI_2 218 may be used to toggle the set and/or reset pins S, R depending on a desired latch output 226. For example, the set S and/or reset R pins may be set such that the latch 205 output 226 is toggled to a value opposite that of its default state. Additionally, because the controller 102 may transmit the SET 214 and/or RESET 215 to the appropriate pins, the controller 102 may synchronize the toggling of the latch output 226.

In some embodiments, the downstream circuit path 222 may include additional latches and set/reset circuitry 224. These downstream latches may be controlled using the clock prioritization and interlocking technique, such that the additional latches are in their proper states to avoid unexpected behavior during and after the NBTI toggling mode and are able to transmit NBTI control signals downstream for even wearing when indicated by the controller 102. In particular, a NBTI control signal may toggle the set pin S and/or reset pin R to deterministically control the output of downstream latches in the downstream circuit path 222, thereby allowing substantially even wearing of downstream semiconductor elements. For example, the signal output 226 by the latch 205 (e.g., NBTI_2 218) may be used to control set/reset circuitry 224, which in turn coordinates the set and/or reset pins of downstream latches, respectively. As another example, the signal output 224 by the latch 205 (e.g., NBTI_2 218) may be fed back to the controller 102, which then controls the set and/or reset pins of downstream logic. Regardless of whether the signal output 226 directly controls the set/reset circuitry 224 and/or whether the signal output 226 causes the controller 102 to control the set/reset circuitry 224, the set/reset circuitry 224 is controlled using the signal output 226. Accordingly, toggling of the set/reset circuitry 224 is based at least in part on NBTI_1 216 and NBTI_2 218 (via the signal output 226).

In some embodiments, during exiting of the NBTI toggling mode and in some cases, the low-power mode, the toggle of the clock pin 206 and of the data pin 208 may be released simultaneously to allow the latch 205 of the circuit path to immediately return to the default state so that no unexpected operations occur. For example, the SET 214 and/or RESET 215 may set the latch 205 to be in a non-default state to propagate the NBTI_2 218 downstream via the set/reset circuitry 224. Removal of the NBTI_1 216 and NBTI_2 218, and thus the toggle of the data pin 208 and the clock pin 206, may reset the latch 205 to its default state. Simultaneous (or substantially simultaneous) removal of the NBTI control signals 216, 218 may occur for all latches of the circuit paths 202, 204, and 222.

In some embodiments, the asserted RESET 215 and/or SET 214 may be removed immediately, followed by the removal of the NBTI_2 218 and then the removal of the NBTI_1 216. Removing the control input signals in reverse order may allow the latch 205 to return to its default state without latching a signal that may be improperly interpreted as a command signal further downstream. In particular, once the asserted RESET 215 and/or SET 214 is removed, the latch 205 state may be modified unless NBTI_1 216 and NBTI_2 218 reach the latch 205. Further, removal of the NBTI_1 last may ensure that latch 205 is set in its default state. As such, the present techniques use asynchronous control signals to provide synchronous and deterministic control of the latches for robust toggling operations and for cleaner NBTI toggle exits, which may facilitate the even wearing of semiconductor elements due to NBTI. It should be appreciated that a variety and number of logic elements may be present in circuitry 200. Additionally, it should be understood that the logic inputs used to drive the control inputs of the latch 205 may be introduced to the latch 205 directly or after propagation via other logic elements. In some embodiments, the controller 102 may begin transmitting the CLK 212 signal to the memory device 106 after a substantial delay after the removal of the respective signals at the data pin 208 and at the clock pin 206.

Figure 3:
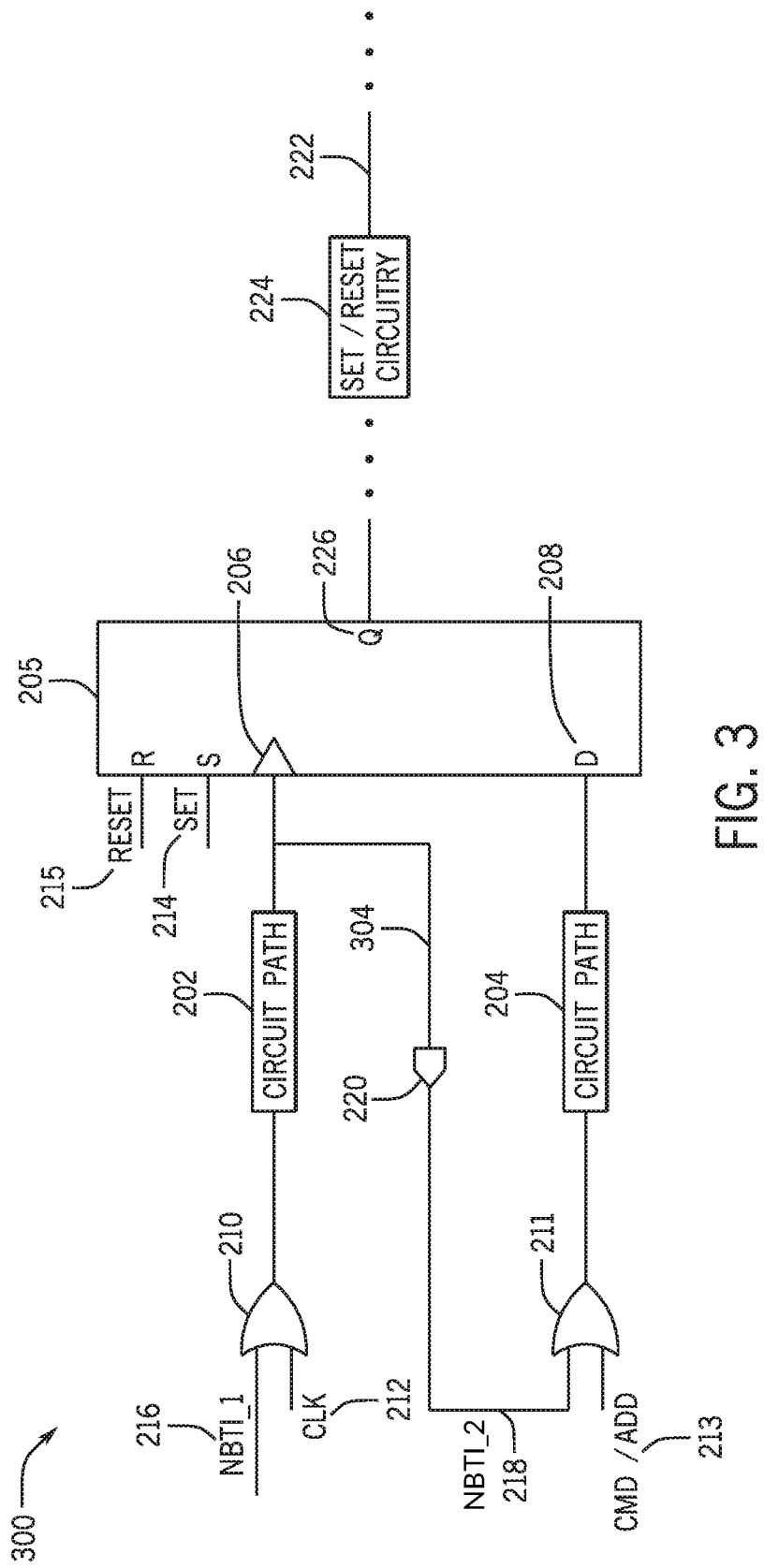
FIG. 3 is a block diagram of circuitry that increases uniformity of semiconductor device wear, in accordance with another embodiment of the present disclosure.

FIG. 3 illustrates a block diagram of circuitry 300 that may control the wearing of semiconductor elements due to NBTI without creating an indeterminate latch state issue, in accordance with an embodiment of the present disclosure. The circuitry 300 may take the second NBTI_2 218 signal that propagates along the circuit path 204 from an output of the circuit path 202. As such, the circuitry 300 may ensure that the clock pin 206 is toggled by the NBTI_1 216 before the data pin 208 is toggled in a manner similar to the circuitry 200. Further, similar to the circuitry 200, the circuitry 300 may use clock prioritization, interlocking, and controlled output toggling to synchronously and deterministically control the latch 205 behavior. Additionally, exiting of the NBTI toggling mode by the logic design 300 may occur in a similar manner as that of the circuitry 200. It should be appreciated that a variety and number of logic elements may be present in the circuitry 300. Additionally, it should be understood that the logic inputs used to drive the control inputs of the latch 205 may be introduced to the latch 205 directly or after propagation via other logic elements.

Figure 4:
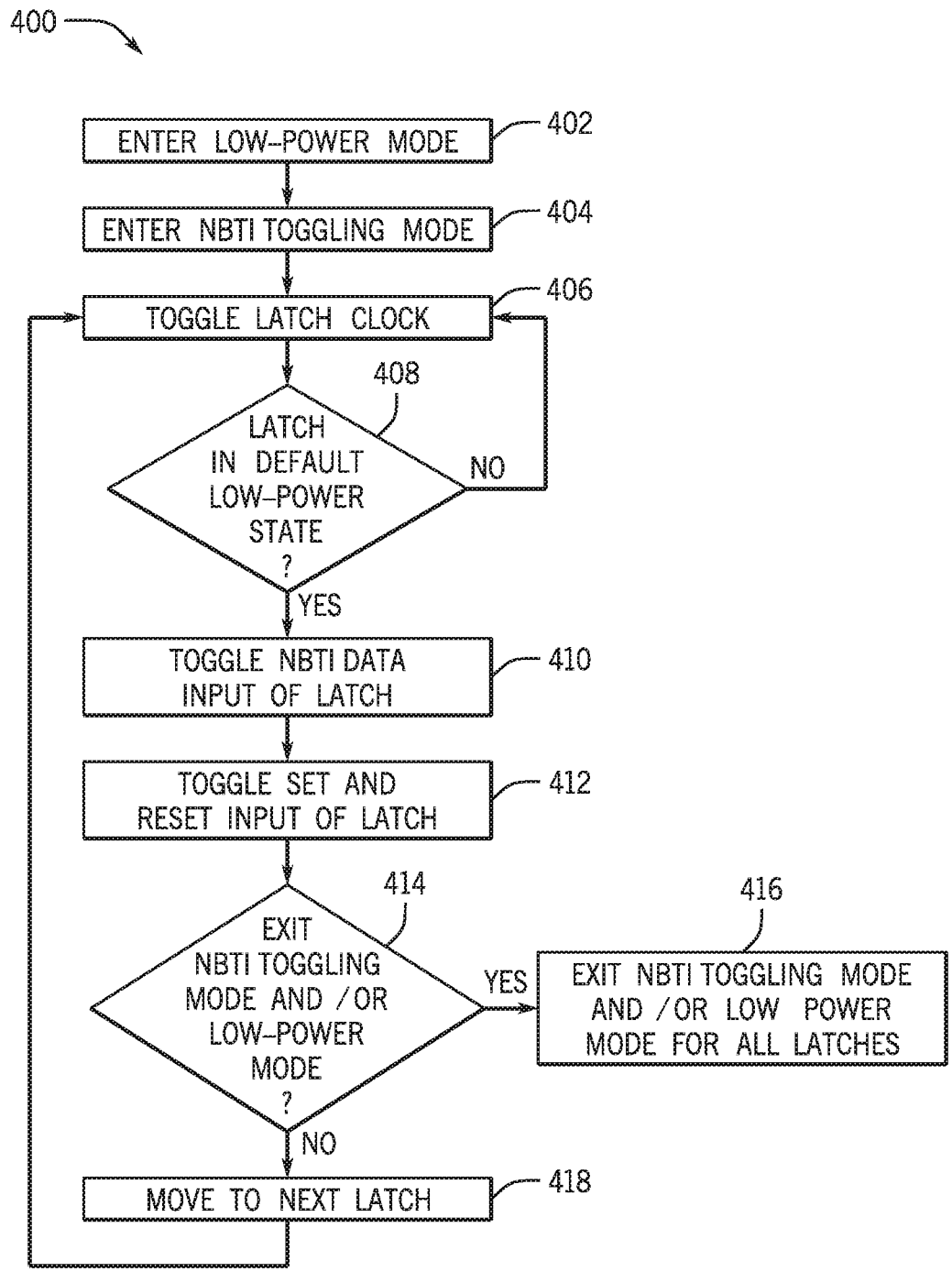
FIG. 4 is a flow diagram of a process for operating the circuitries of FIGS. 2 and 3, in accordance with an embodiment of the present disclosure.

FIG. 4 is a process 400 for operating the circuitries 200 and 300 to increase uniformity of wearing of semiconductor elements of the semiconductor memory device 106 without creating an indeterminate latch state issue, in accordance with an embodiment of the present disclosure. While the process 400 is described using steps in a specific sequence, it should be understood that the present disclosure contemplates that the described steps may be performed in a different order than the sequence illustrated, and certain described steps may be skipped or not performed altogether. In some embodiments, at least some of the steps of the process 400 may be implemented at least in part by the controller 102 that executes instructions stored in a tangible, non-transitory, computer-readable medium, such as the controller memory 110. In alternative or additional embodiments, at least some steps of the process 400 may be implemented by any other suitable components or control logic, such as another electronic device, and the like.

The process 400 may begin when the controller 102 indicates to the memory device 106 to enter low-power mode (process block 402). Because NBTI effects may still operate in low-power mode, the controller 102 may signal the memory device 106 to enter NBTI toggling mode (process block 404). The controller 102 may signal the toggling circuitry 104 to transmit a first NBTI control signal (e.g., NBTI_1 216) to the memory device 106 to toggle the clock pin 206 of the latch 205, thereby setting the latch to its default state (e.g., closed, non-transmitting) (process block 406). When the latch 205 is determined to be in its default low-power state, a second NBTI control signal (e.g., NBTI_2 218) may be generated by delaying the first NBTI control signal and may be transmitted to data pin 208 of the latch 205 to toggle the data pin 208 (decision block 408; process block 410). The controller 102 may send a set (e.g., SET 214) and/or reset (e.g., RESET 215) signal to the set pin S and reset pin R to toggle the set S and reset R input of the latch 205, thereby controlling whether the second NBTI control signal is transmitted downstream to uniformly stress downstream elements (process block 412).

The controller 102 may determine whether the memory device 106 should exit the NBTI toggling mode and/or the low-power mode, such as when inputs are received by the electrical system 100 (decision block 414). When the memory device 106 should remain in the NBTI toggling mode and/or low-power mode, the deterministic control of another latch downstream may begin using the clock prioritization and interlocking schemes described above (process block 418). When the memory device 106 should exit the NBTI toggling mode and/or the low-power mode, the first NBTI control signal and the second NBTI control signal may be removed such that the signals at the clock pin 206 and at the data pin 208 are removed simultaneously (process block 416). By simultaneously releasing the signals at the data pin 208 and the clock pin 206 of the latches 205, including the downstream latches, the latches 205 may immediately return to the default state so that no unexpected operations occur while exiting the NBTI toggling mode. Additionally, the control input signals may be released in reverse order (e.g., SET and/or RESET, followed by NBTI_2, and then NBTI_1) to return the latches to their default state.

The present disclosure contemplates additional techniques for synchronously controlling the latches in a deterministic manner. In some contemplations, only clock prioritization is used to control the latches 205. However, implementing only clock prioritization may close the latches 205 such that no signal may propagate through the latches 205 and further downstream to evenly wear the downstream elements. Further contemplations include giving the clock least priority. Such contemplations however, provide coordination issues since the latch 205 may be in a non-default state and as such, may exhibit unpredictable behavior.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electrical system, comprising:
   toggling circuitry configured to generate a first negative-bias temperature instability (NBTI) control signal configured to be transmitted through a first circuit path;
   a delay element configured to generate a second NBTI control signal based at least in part on the first NBTI control signal and configured to be transmitted through a second circuit path; and
   a latch, wherein toggling of the latch is based at least in part on the first NBTI control signal and the second NBTI control signal to propagate an NBTI state of the electrical system, and wherein the first NBTI control signal and the second NBTI control signal are received at respective inputs of the latch.

2. The electrical system of claim 1, wherein the electrical system comprises a controller configured to cause the generation of the first NBTI control signal in response to at least a portion of the electrical system entering an NBTI toggling mode.

3. The electrical system of claim 1, comprising a semiconductor memory device that comprises the toggling circuitry and the latch.

4. The electrical system of claim 1, wherein the latch comprises the respective inputs receiving the first NBTI control signal and the second NBTI control signal comprise a clock input pin and a data input pin.

5. The electrical system of claim 4, wherein the latch is configured to receive the first NBTI control signal at the clock input pin.

6. The electrical system of claim 4, wherein the latch is configured to receive the second NBTI control signal at the data input pin.

7. The electrical system of claim 4, wherein exiting an NBTI toggling mode comprises simultaneously removing the first NBTI control signal at the clock input pin and removing the second NBTI control signal at the data input pin.

8. The electrical system of claim 4, wherein exiting an NBTI toggling mode comprises:
   removing the second NBTI control signal at the data input pin; and
   after removing the second NBTI control signal at the data input pin, removing the first NBTI control signal at the clock input pin.

9. The electrical system of claim 1, wherein generation of the second NBTI control signal comprises delaying the first NBTI control signal using the delay element after the first NBTI control signal has passed through the first circuit path.

10. The electrical system of claim 1, wherein the latch comprises a set pin and a reset pin.

11. The electrical system of claim 1, comprising an OR gate of the second circuit path that is configured to transmit an output that is an OR of the second NBTI control signal and a data signal.

12. The electrical system of claim 1, comprising a downstream latch configured to propagate an NBTI state of the electrical system by receiving a control signal based at least in part on the second NBTI control signal at a set pin of the downstream latch, at a reset pin of the downstream latch, or a combination thereof.

13. The electrical system of claim 1, wherein a portion of the electrical system is configured to enter an NBTI toggling mode in response to the at least a portion of the electrical system entering a low-power mode.

14. A method for operating a negative-bias temperature instability (NBTI) toggling mode, comprising:
receiving a first NBTI control signal; —
asserting the first NBTI control signal at a clock input pin of a latch;
toggling electrical elements downstream of the latch based at least in part on the first NBTI control signal;
receiving a second NBTI control signal; and
asserting the second NBTI control signal at a data input pin of the latch.

15. The method of claim 14, wherein the latch comprises a set pin and a reset pin.

16. The method of claim 15, comprising asserting a set signal at the set pin of the latch, a reset signal at the reset pin of the latch, or a combination thereof.

17. An electronic device, comprising:
a first circuit path;
a second circuit path; and
a latch configured to:
receive a first negative-bias temperature instability (NBTI) control signal at a clock pin of the latch via the first circuit path; and
receive a second NBTI control signal via the second circuit path, wherein the first NBTI control signal and the second NBTI control signal are configured to toggle an output of the latch, and the second NBTI control signal is received at another input of the latch.

18. The electronic device of claim 17, wherein the second NBTI control signal is generated after the first NBTI signal is generated.

19. The electronic device of claim 17, wherein the output of the latch is sent to a controller, wherein the controller will control electrical elements downstream of the latch based on the output of the latch.

20. The electronic device of claim 17, wherein the other input comprises a data input of the latch.

* * * * *